(12) United States Patent
Farooq et al.

(10) Patent No.: US 8,691,691 B2
(45) Date of Patent: Apr. 8, 2014

(54) TSV PILLAR AS AN INTERCONNECTING STRUCTURE

(75) Inventors: Mukta G. Farooq, Hopewell Junction, NY (US); Troy L. Graves-Abe, Wappingers Falls, NY (US); William F. Landers, Wappingers Falls, NY (US); Kevin S. Petrarca, Newburgh, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 13/194,214

(22) Filed: Jul. 29, 2011

(65) Prior Publication Data

US 2013/0026606 A1   Jan. 31, 2013

(51) Int. Cl.
*H01L 21/44* (2006.01)
*H01L 21/311* (2006.01)

(52) U.S. Cl.
USPC ........... 438/667; 438/629; 438/643; 438/653; 438/672; 438/700; 438/648; 438/656; 257/E21.577

(58) Field of Classification Search
USPC ......... 438/667, 648, 656, 629, 643, 653, 672; 257/E21.577
See application file for complete search history.

(56) References Cited

U.S. PATENT DOCUMENTS

| 6,914,336 | B2 * | 7/2005 | Matsuki et al. | 257/769 |
|---|---|---|---|---|
| 7,034,401 | B2 | 4/2006 | Savastiouk et al. | |
| 7,241,641 | B2 | 7/2007 | Savastiouk et al. | |
| 7,241,675 | B2 | 7/2007 | Savastiouk et al. | |
| 7,932,608 | B2 | 4/2011 | Tseng et al. | |
| 8,026,592 | B2 * | 9/2011 | Yoon et al. | 257/698 |
| 8,278,218 | B2 * | 10/2012 | Oh et al. | 438/685 |
| 8,466,059 | B2 * | 6/2013 | Chang et al. | 438/667 |
| 8,501,587 | B2 * | 8/2013 | Chen et al. | 438/459 |
| 8,513,119 | B2 * | 8/2013 | Chang et al. | 438/667 |
| 2004/0155354 | A1 * | 8/2004 | Hanaoka et al. | 257/774 |
| 2006/0001174 | A1 * | 1/2006 | Matsui | 257/774 |
| 2006/0148250 | A1 * | 7/2006 | Kirby | 438/667 |
| 2007/0048994 | A1 * | 3/2007 | Tuttle | 438/597 |
| 2009/0130846 | A1 | 5/2009 | Mistuhashi | |
| 2010/0127345 | A1 | 5/2010 | Sanders et al. | |
| 2010/0155888 | A1 | 6/2010 | Christo et al. | |
| 2010/0164117 | A1 * | 7/2010 | Chen | 257/774 |
| 2010/0178761 | A1 * | 7/2010 | Chen et al. | 438/613 |
| 2010/0187694 | A1 | 7/2010 | Yu et al. | |

(Continued)

OTHER PUBLICATIONS

Zhang et al., "Development of through silicon via (TSV) interposer technology for large die (21×21mm) fine-pitch Cu/low-k FCBGA package," Electronic Components and Technology Conference, 2009. ECTC 2009. 59th, pp. 305-312, May 26-29, 2009.

*Primary Examiner* — Nitin Parekh
(74) *Attorney, Agent, or Firm* — Jason H. Sosa (57) ABSTRACT

The present invention includes embodiments of a processing method, and resulting structure, for building a chip having a TSV pillar which can be used as an interconnecting structure. The process includes the deposition of a dual diffusion barrier between the TSV and the substrate the TSV is embedded within. The TSV is then exposed from the back side of the substrate so that at least a portion of the TSV protrudes from the substrate and can be used as a contact for connecting the chip to another surface. The resulting TSV is rigid, highly conductive, can be placed in a tightly pitched grid of contacts, and reduces effects of CTE mismatch.

16 Claims, 9 Drawing Sheets

(56) References Cited

U.S. PATENT DOCUMENTS

| | | |
|---|---|---|
| 2010/0206737 A1 | 8/2010 | Preisser |
| 2010/0237502 A1 | 9/2010 | Yu et al. |
| 2011/0006428 A1 | 1/2011 | Lo et al. |
| 2011/0018107 A1 | 1/2011 | Bonifield et al. |
| 2011/0079909 A1 | 4/2011 | Furuya |
| 2011/0095428 A1 | 4/2011 | Andry et al. |
| 2011/0095435 A1 | 4/2011 | Volant et al. |

* cited by examiner

TSV PILLAR AS AN INTERCONNECTING STRUCTURE

FIELD OF THE INVENTION

The disclosure relates generally to integrated circuit chips and more specifically to attaching integrated circuit chips to other substrates.

BACKGROUND

Integrated circuit chips (also referred to as "IC chips" or "chips") are typically encapsulated into a package, which often includes a ceramic or plastic substrate. Other materials, such as an organic laminate, may be used for the substrate. The substrate provides the package with a mechanical base support and a form of electrical interface that would allow the external world to access devices on the chip housed within the package. The chip package typically attaches to a printed circuit board (PCB).

To increase space utilization, two or more chips may be attached to a PCB in a stacked arrangement. The chip stack is referred to as a three dimensional (3D) package. A chip with the capability of being used in a 3D package, referred to herein as a 3D chip, utilizes through-silicon vias (TSVs), also known as through-substrate vias, to pass electrical signals from one side of the chip to another.

A chip can be attached to a package substrate, to another chip, or even directly to a PCB utilizing C4 (Controlled Collapse Chip Connection) bumps to bond the chip to a substrate or board and provide electrical interconnection. C4 bumps connect input/output (I/O) connection terminals, or contact pads, on the chip to contact pads on the surface it connects to. Typically, a large number of contact pads are disposed in a two dimensional array over a substantial portion of a major surface of the chip (such as in a ball grid array—BGA).

The bumps can be made of solder. After the chip is placed on the connecting surface, the solder is heated and reflowed to form solder joints. This attachment is mechanically strong and reliable in the presence of thermal stresses. However, as the contact pads become smaller and the pitch (the center to center spacing between the contact pads) is reduced, the solder bump sizes are also reduced. As the solder bump size decreases, the solder joints become mechanically and thermally weaker. In addition, the solder ball size defines the standoff distance between the chip and the surface the chip connects to. If the standoff becomes too small, there are increased fatigue stresses on the solder joints during thermal cycling and a greater possibility of undesirable residues remaining in that space and causing degradation.

To obtain better scalability, as well as reduce electromigration concerns, designers sometimes replace C4 bumps made of solder with more defined conductive structures, such as copper pillars or copper pedestals. A copper pillar can be plated onto a contact pad and then solder can be plated onto the copper pillar to make the connection.

With the use of copper pillar bumps, the stresses imposed on the chip, especially during the cool-down from the chip join process, are not as well mitigated as with the use of solder bumps. The high shear stresses caused by the CTE (coefficient of thermal expansion) mismatch between the chip and a laminate, now connected by a more rigid conductive structure, results in a higher probability of C4 interconnection defects (i.e., small cracks or voids in the chip metallurgy under C4 bumps).

To maintain a rigid contact structure that would both allow for reduced pitch and minimize strains in the interconnection, portions of TSVs embedded in a semiconductor substrate may be exposed to form protruding contact pads or pillars, which may then be used in interconnecting the substrate. This is often used in the case of a silicon interposer, where a substrate acts as an intermediate layer used for interconnection routing or as a ground/power plane. A silicon interposer may itself be considered an integrated circuit chip. A silicon interposer may also have an intermediate CTE somewhere between a chip and the PCB the interposer connects the chip to. However, this technology need not be limited to interposers, and 3D chips that have devices may also utilize embedded TSVs in this manner.

SUMMARY

One aspect of the present invention discloses a method for building a through-substrate via (TSV) for interconnecting an integrated circuit chip. The method comprises etching a TSV hole into a semiconductor substrate from one face of the semiconductor chip, wherein the TSV hole has a depth less than an entire depth of the semiconductor substrate. Deposit a first diffusion barrier layer on the semiconductor substrate at a periphery of the TSV hole. Subsequently deposit an insulation layer on a surface of the first diffusion barrier layer. Subsequently deposit a second diffusion barrier layer on a surface of the insulation layer. Then deposit a conductive material interior to the second diffusion barrier layer within the TSV hole. Thin the semiconductor substrate from an opposite face of the substrate to expose at least a portion of the TSV.

Another aspect of the present invention discloses an alternate method for building a through-substrate via (TSV) for interconnecting an integrated circuit chip. The alternate method begins by thinning the semiconductor substrate from a back face of the semiconductor substrate. Etch a TSV hole through the semiconductor substrate from the back face to a contact pad. Deposit one or more barrier layers on the semiconductor substrate at a periphery of the TSV hole. Deposit a conductive material interior to the one or more barrier layers within the TSV hole, wherein the conductive material electrically connects to the contact pad.

A third aspect of the present invention discloses the resulting through-substrate via (TSV) passing through a semiconductor substrate. The TSV comprises a conductive material, a first diffusion barrier layer surrounding at least a portion of outer sidewalls of the conductive material, an insulation layer surrounding at least a portion of the first diffusion barrier layer, and a second diffusion barrier layer surrounding at least a portion of the insulation layer.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on", "positioned on", "on top", or "positioned atop" mean that a first element, such as a first structure, is present on a second element, such as a second structure, wherein intervening elements, such as an interface structure may be present between the first element and the second element. The term "direct contact" means that a first element and a second element are connected without any intermediary conducting, insulating or semiconductor layers at the interface of the two elements.

Illustrative embodiments provide for a method of building an interconnecting TSV pillar and the resulting interconnecting structure.

Figure 1:
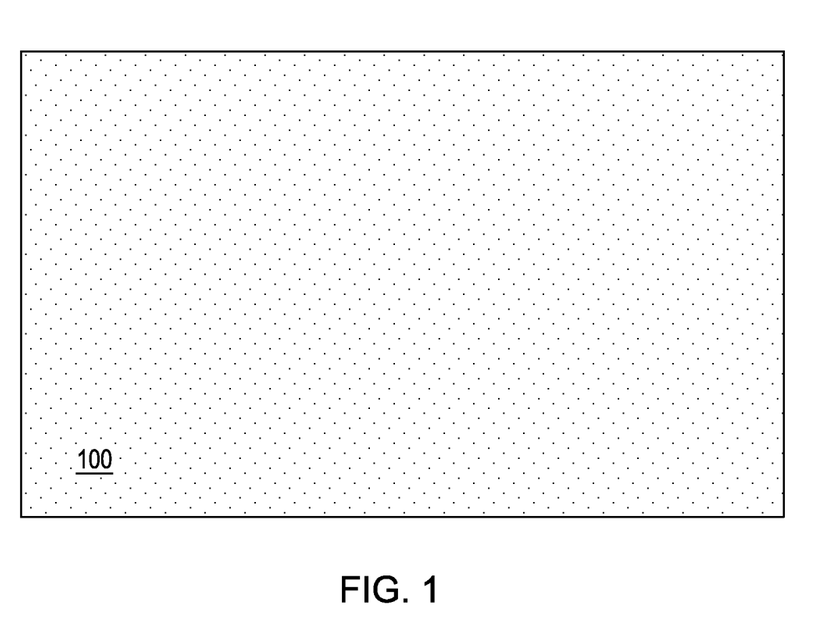
FIG. 1 depicts a semiconductor substrate within which embodiments of the present invention may be formed.

FIG. 1 depicts a semiconductor substrate within which embodiments of the present invention may be formed. Semiconductor substrate 100 is preferably composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. Semiconductor substrate 100 may also be composed of other semiconductor materials, such as germanium, and compound semiconductor substrates, such as type III/V semiconductor substrates, e.g., GaAs. Although semiconductor substrate 100 is depicted as a bulk semiconductor substrate, semiconductor on insulator (SOI) substrate arrangements, such as silicon on insulator substrates, are also suitable for semiconductor substrate 100.

Figure 2:
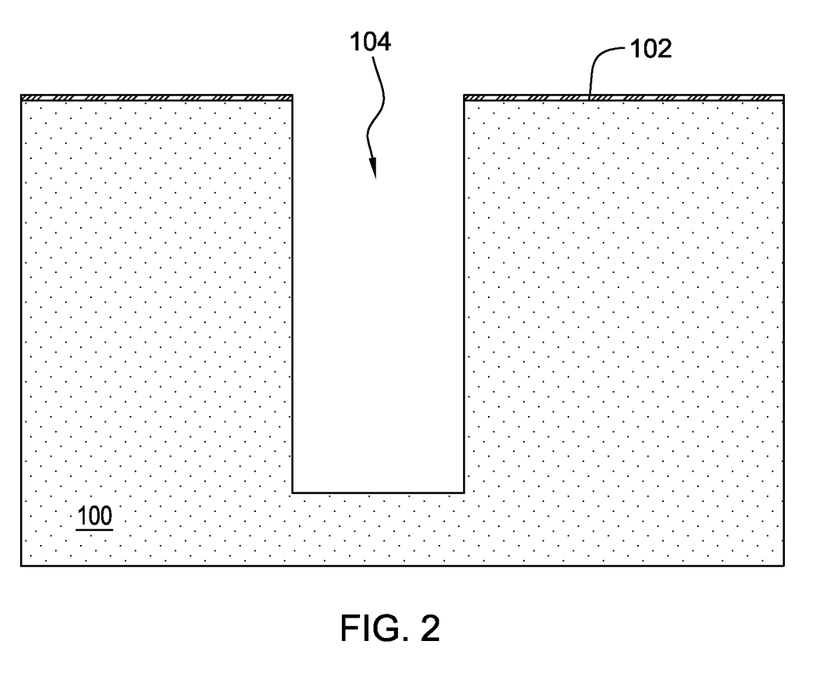
FIG. 2 illustrates a process of etching a TSV hole into a semiconductor substrate in accordance with an embodiment of the present invention.

FIG. 2 illustrates a process of etching a TSV hole into a semiconductor substrate in accordance with an embodiment of the present invention. Mask 102 is formed upon substrate 100 to define a width of TSV hole 104. The width is typically 10 to 100 µm. In some embodiments, that width may be reduced further. For example, known widths have been as small as 6 microns. Mask 102 comprises an etchant resistant material, such as silicon nitride (SiN), which may also form an insulating layer. Other etchant resistant materials may be used. In one embodiment a photoresist, or soft mask, may be used. Mask 102 may be applied using chemical vapor deposition (CVD), plasma enhanced chemical vapor deposition (PECVD), or physical vapor deposition (PVD).

TSV hole 104 is etched into substrate 100 through mask 102. This hole typically extends anywhere from 50 to 100 microns, and does not extend completely through substrate 100. Though the TSV may be etched before or after FEOL processing (device creation) on the wafer substrate, in the preferred embodiment the TSV is etched into substrate 100 after FEOL processing.

Figure 3:
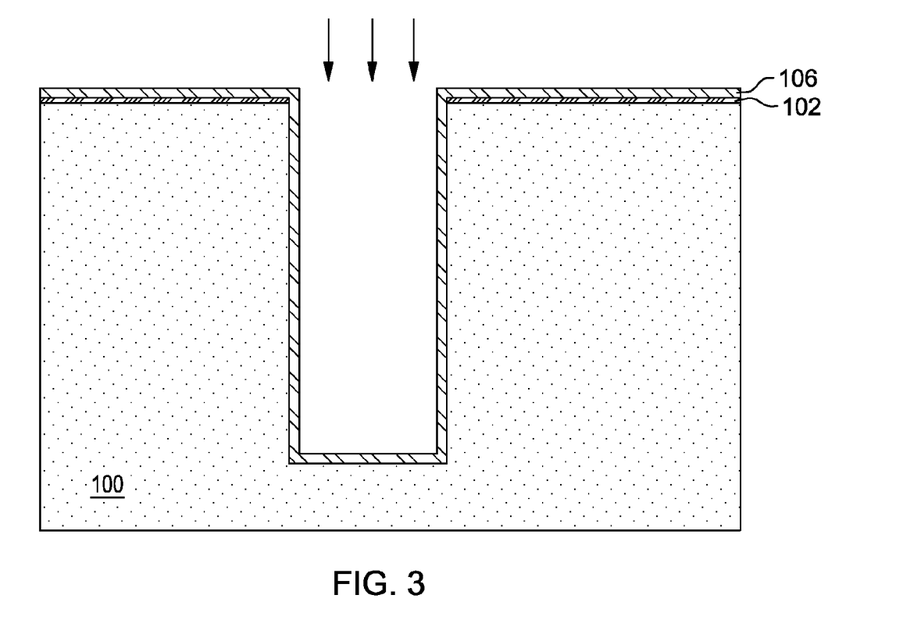
FIG. 3 depicts the forming of a first diffusion barrier layer along the inner surfaces of the TSV hole of FIG. 2.

FIG. 3 depicts the forming of a first diffusion barrier layer. Diffusion barrier layer 106 is preferably a conformal layer that helps to prevent the diffusion of the larger conductive portion of the TSV (normally copper) from diffusing into semiconductor substrate 100. Diffusion barrier layer 106 should be "conformal" in the sense that the material is deposited with similar thickness on all exposed surfaces, and especially on sidewalls of TSV hole 104. Diffusion barrier layer 106 is normally on the order of a few thousand angstroms or less. In the depicted embodiment of FIG. 3, diffusion barrier layer 106 is also deposited over the top of mask 102. Diffusion barrier layer 106 is preferably composed, at least partially, of a refractory metal. Refractory metals include niobium (Nb), molybdenum (Mo), tantalum (Ta), tungsten (W), and rhenium (Re). The preferred embodiment is Tantalum Nitride (TaN). Other examples of materials that may be used in diffusion barrier layer 106 include: nickel, tungsten nitride, and titanium nitride. Diffusion barrier layer 106 may be applied using sputtering, CVD, or atomic layer deposition (ALD) techniques. In the preferred embodiment, diffusion barrier layer 106 is in direct contact with the substrate 100 within TSV hole 104.

Figure 4:
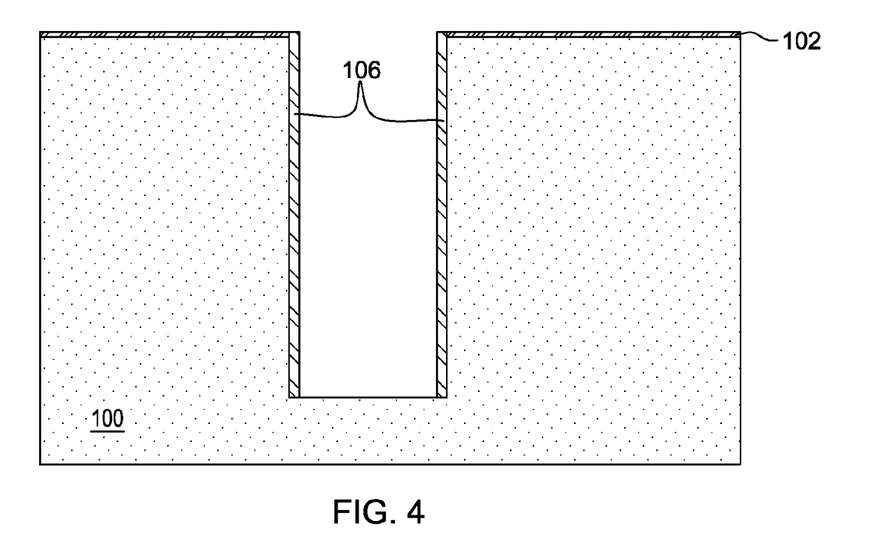
FIG. 4 illustrates an anisotropic etch of the diffusion barrier layer of FIG. 3 in accordance with an embodiment.

FIG. 4 illustrates an anisotropic etch of diffusion barrier layer 106 in accordance with an embodiment. Once diffusion barrier layer 106 has been deposited, an anisotropic etch is performed. The etch is "anisotropic" in the sense that the etch has a directional preference in attacking the horizontal portions of diffusion barrier layer 106 while leaving vertical portions thereof undisturbed. The result of the anisotropic etch is diffusion barrier layer 106 coating the sidewalls of TSV hole 104.

Figure 5:
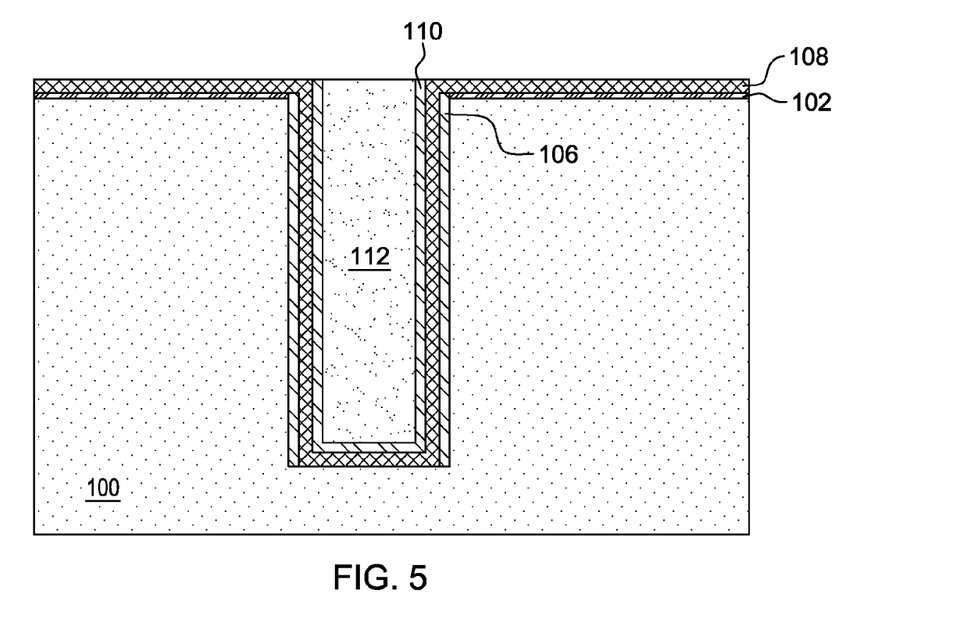
FIG. 5 depicts the deposition of an insulation layer, a second diffusion barrier layer, and a conductive material in accordance with an embodiment of present invention.

FIG. 5 depicts the deposition of an insulation layer, a second diffusion barrier layer, and a conductive material in accordance with an embodiment of present invention. Insulation layer 108 is preferably a CVD oxide, but may also be a low temperature oxide or a nitride material in other embodiments. In one embodiment, insulation layer 108 is formed over the entire surface of the semiconductor structure and lines the inner edges (both sidewalls and the bottom surface) of via hole 104. Subsequent to the deposition of insulation layer 108, a second diffusion barrier, diffusion barrier layer 110, is deposited within TSV hole 104.

Due to the extra processing steps involved in exposing portions of TSVs to be used as contact pads, diffusion of the conductive material in the TSV becomes a greater concern. Under thermal agitation, such as high temperatures created during processing steps, atoms of the conductive material (e.g., Cu atoms) can diffuse into surrounding oxide or insulation layers and even into the semiconductor substrate 100. Longer and repeated exposures to those temperatures increase the rate of diffusion and the opportunity for barrier failure, causing atoms to diffuse through a diffusion barrier. Diffusion of conductive materials into the oxide or insulation layer(s) drops resistance and leads to electrical leakage. This could eventually create separate electrical paths to the device or to other devices. Even if the diffusion does not short circuit the device, it may cause changes to the characteristics of device operation (known as "poisoning" the device). Additionally, diffusion into substrate 100 can affect doping concentrations. The use of a dual diffusion barrier (diffusion barrier layer 106 and diffusion barrier layer 110 separated by at least one insulation layer, such as insulation layer 108) provides extra protection against this concern. The preferred embodiment has diffusion barrier layer 106 in direct contact with substrate 100 and diffusion barrier layer 110 in direct contact with the conductive material of the TSV.

Diffusion barrier layer 110 preferably comprises TaN, but like diffusion barrier layer 106, may be composed of any other material suitable for preventing diffusion into substrate 100.

In the remaining opening of TSV hole 104, conductive element 112 is deposited. Conductive element 112 is preferably copper (Cu) and comprises a substantial portion of the TSV. Cu is typically deposited in a damascene process consisting of physical vapor deposition of a Cu seed layer that can have a thickness of a few thousand angstroms, followed by electroplating to fill the via. A chemical mechanical polish (CMP) step is then used to remove the Cu deposited in the field. The CMP process may also remove any portions of the diffusion barrier layers 106 and 110 and isolation layer 108 left on the top face of substrate 100. The TSV as a whole comprises the conductive element 112, diffusion barrier layer 110, isolation layer 108, and diffusion barrier layer 106. In other embodiments, other seeding layers, metal layers, and isolation layers may be included. In one embodiment, conductive element 112 may be annular leaving a center ring which may be hollow or filled with some alternative material. In the preferred embodiment, conductive element 112 is in direct contact with diffusion barrier layer 110.

Figure 6:
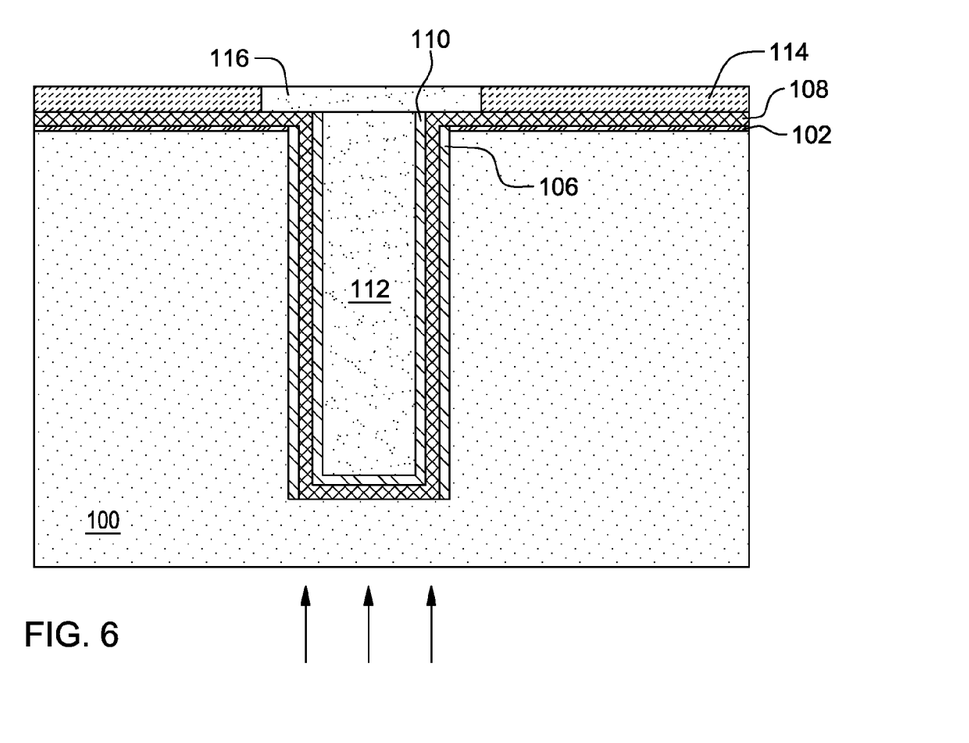
FIG. 6 illustrates the forming of a contact pad on the top side of a substrate in electrical connection with the conductive portion of a TSV in accordance with an embodiment of the present invention.

FIG. 6 illustrates the forming of a contact pad on the top side of a substrate in electrical connection with the conductive portion of a TSV in accordance with an embodiment of the present invention.

I/O contact pad 116 is formed in electrical connection with conductive element 112 of the TSV. I/O contact pad 116 is surrounded by dielectric material 114. In the depicted embodiment, in addition to the electrical connection, I/O contact pad 116 is in direct contact with conductive element 112. In an alternative embodiment, there may be one or more intervening layers and/or structures. For example, there may be one or more devices coupled to substrate 100 and one or more wiring levels (such as BEOL wiring levels), separated by one or more dielectric layers, electrically connected to the one or more devices and the conductive element 112. Wiring levels are interconnected through the dielectric layers by conductive vias and ultimately connect to I/O contact pad 116. I/O contact pad 116 is made of a conductive material, preferably aluminum or copper.

The resulting structure is now subject to back side processing to expose portions of the TSV. To perform the back side processing steps, the top face of the wafer or chip is typically adhesively attached to a glass carrier (not shown). Attachment to a carrier is known in the art. As an alternative, the wafer or chip may be bonded to a second chip or wafer.

Figure 7:
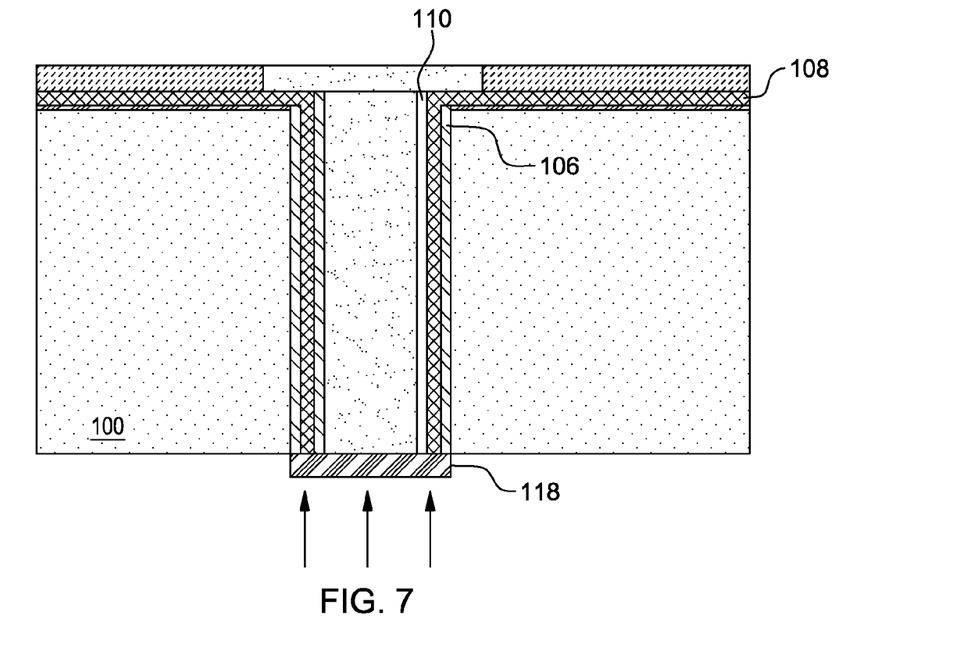
FIG. 7 depicts a thinning process of the back side of the substrate and the formation of a masking cap over the TSV, in accordance with an embodiment of the present invention.

FIG. 7 depicts a thinning process of the back side of the substrate and the formation of a masking cap over the TSV, in accordance with an embodiment of the present invention.

The thinning process (e.g., mechanical grinding, chemical-mechanical-polishing (CMP), or chemical or plasma etching) continues until the TSV extends all the way through the semiconductor substrate. This preferably occurs evenly across the chip. The thinning process preferably removes any remaining horizontal portions of diffusion barrier layer 106, isolation layer 108, and diffusion barrier layer 110.

The thinning process is followed by depositing masking cap 118 over the exposed end of the TSV. Masking cap 118 is preferably SiN, but in various embodiments may be any etchant resistant material.

Figure 8:
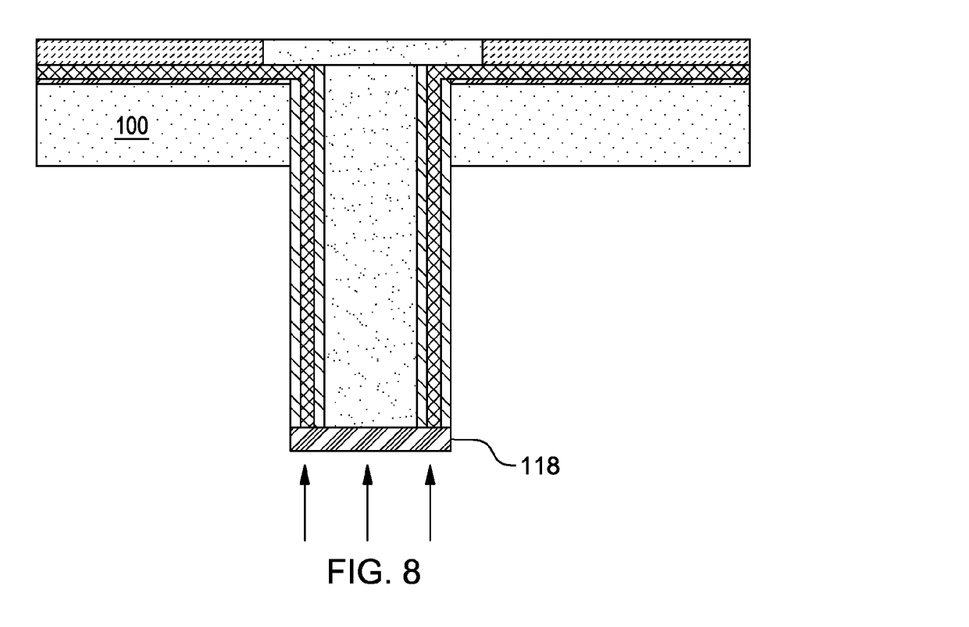
FIG. 8 illustrates a substrate (silicon) etch to expose a bottom portion of the TSV, in accordance with one embodiment.

FIG. 8 illustrates a substrate (silicon) etch to expose a bottom portion of the TSV, in accordance with an embodiment.

The etchant is selective to the material of masking cap 118 and the outer layer of the TSV, which in the depicted embodiment is diffusion barrier layer 106. The substrate etch exposes a length of the TSV less than the entire depth of the substrate 100. In one embodiment, the exposed length of the TSV is ten to thirty microns.

Figure 9:
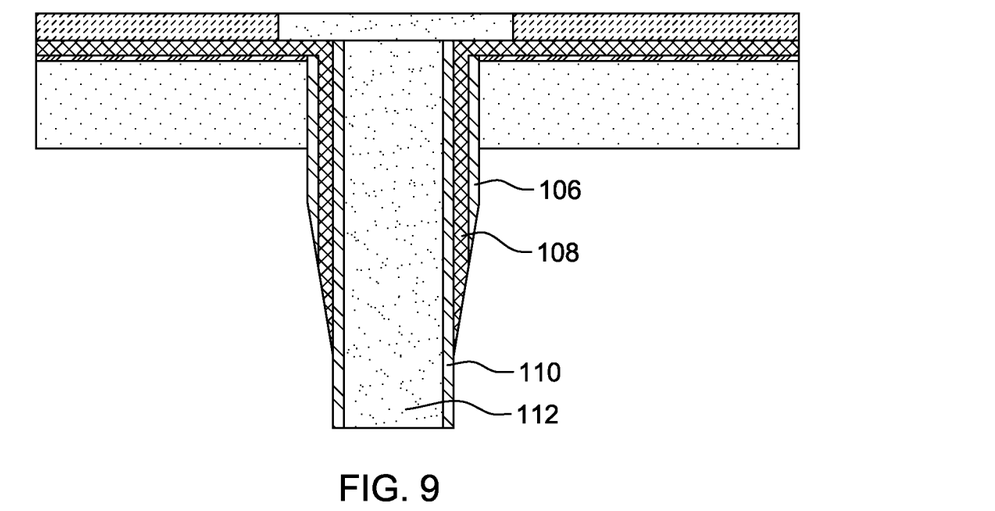
FIG. 9 depicts a dielectric etch used to remove the masking cap of FIG. 7.

FIG. 9 depicts a dielectric etch used to remove masking cap 118. Preferably this etch step is performed using a reactive-ion etch (RIE). A RIE is considered a dry etch and may slowly degrade the outer layers of the TSV, such as diffusion barrier layer 106, isolation layer 108, and diffusion barrier layer 110, leaving the outer layers slightly tapered. However, this degradation will leave the dual diffusion barrier, composed of diffusion barrier layers 106 and 110 and isolation layer 108, intact between substrate 100 and conductive element 112.

Figure 10:
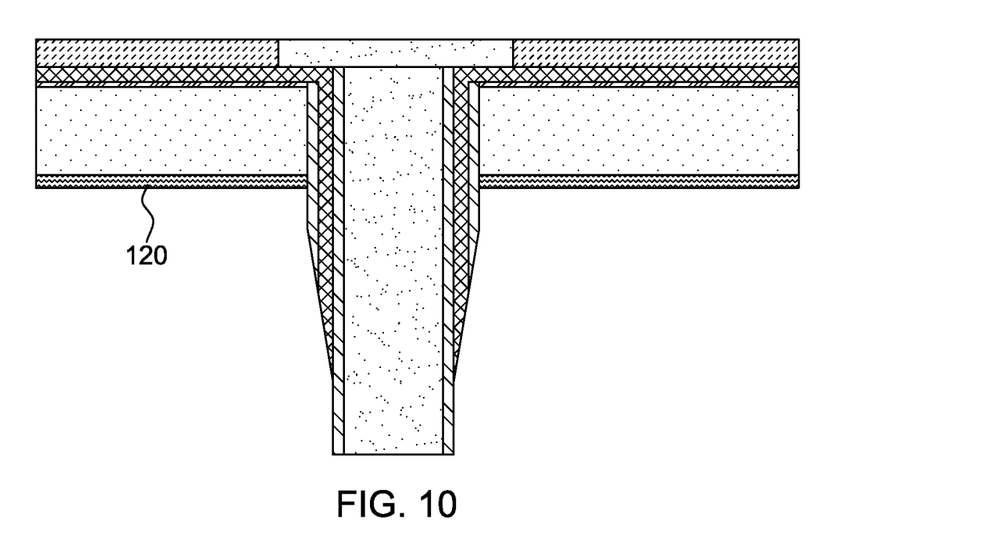
FIG. 10 illustrates the deposition of a dielectric layer to the bottom of a substrate.

FIG. 10 illustrates the deposition of a dielectric layer to the bottom of substrate 100. Dielectric layer 120 is preferably a polyimide and acts to isolate semiconductor substrate 100 and the TSV. Polyimide is desirable for its thermo-stability, which gives dielectric layer 120 the ability to withstand the bonding process. Alternatively, a dielectric underfill may be dispensed on the surface that the TSV will connect to.

Together, FIGS. 1 through 10 represent the steps of an exemplary process for creating a TSV pillar for interconnecting an IC chip with a chip, substrate, or circuit board.

Figure 11:
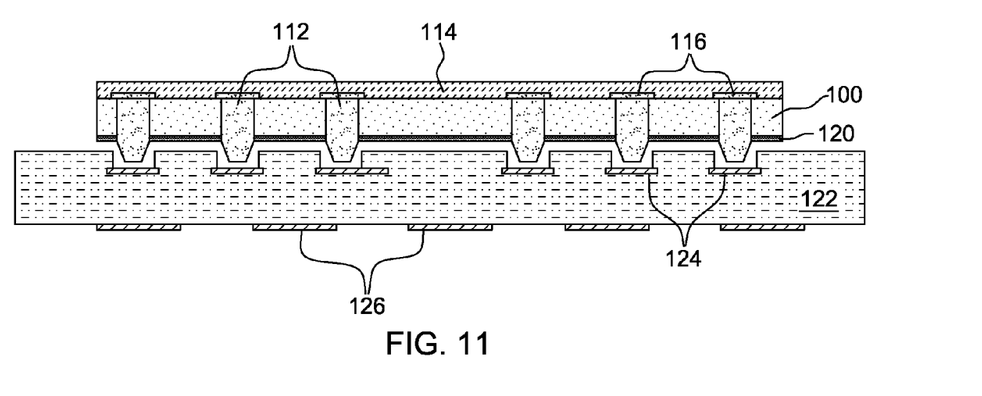
FIG. 11 depicts an exemplary resulting IC chip from the process and structures described in FIGS. 1 through 10.

FIG. 11 depicts an exemplary resulting IC chip from the process and structures described in FIGS. 1 through 10.

Substrate 100 contains multiple TSVs represented by respective conductive elements 112. Each conductive element 112 is encased by a dual diffusion barrier (not shown) as described above. Conductive elements 112 electrically connect to contact pads 116 which are embedded in dielectric material 114. The bottom of the substrate 100 is lined with dielectric layer 120.

In the depicted example, the IC chip represented connects to substrate 122 through contact pads 124. Solder (not shown) is used to make the join. Substrate 122 may be a BT substrate of a chip package, or alternatively may represent a second IC chip. Metal lines (not shown) within substrate 122 may connect contact pads 124 to contact pads 126 on the bottom side of substrate 122. In an alternative embodiment, the IC chip may connect directly to contacts of a PCB.

FIGS. 12 through 15 represent steps of an alternative exemplary process for forming a TSV pillar.

Figure 12:
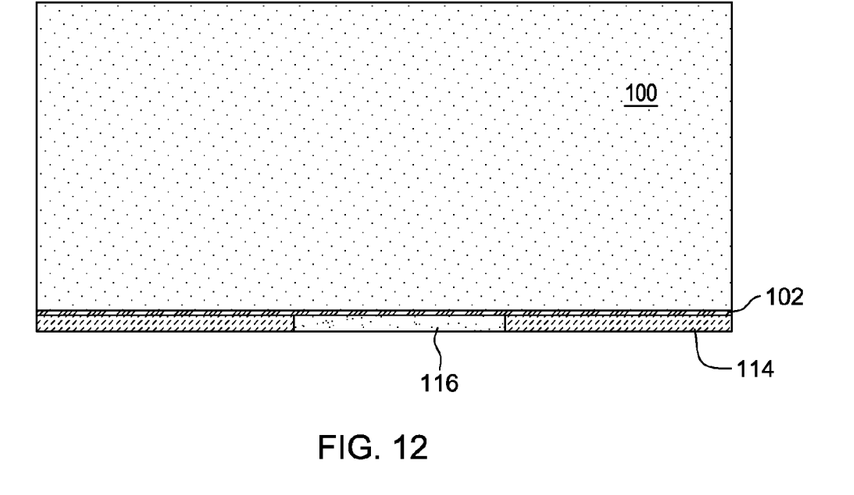
FIG. 12 illustrates a starting point for creating a TSV pillar from the back side, in accordance with one embodiment.

FIG. 12 illustrates a starting point for creating a TSV pillar from the back side, in accordance with an embodiment. In this case, mask 102 is formed over the surface of substrate 100 without the etching of a TSV hole. Though mask 102 does not technically create a "mask" for etching the TSV hole, this layer may still be used as an added isolation barrier for substrate 100 or as an etch stop layer during back side processing. Another embodiment may be devoid of mask 102.

I/O contact pad 116 is formed over substrate 100 and is surrounded by dielectric material 114.

In FIG. 12, the chip is flipped to show that the main processing steps for creating the TSV occur from the back side of the chip. Prior to the creation of the TSV, substrate 100 is subject to a thinning process which reduces the thickness of the substrate to a desired length for the TSV. This will typically be in the range of fifty to one hundred microns, though the length is not limited to this range in all embodiments.

Figure 13:
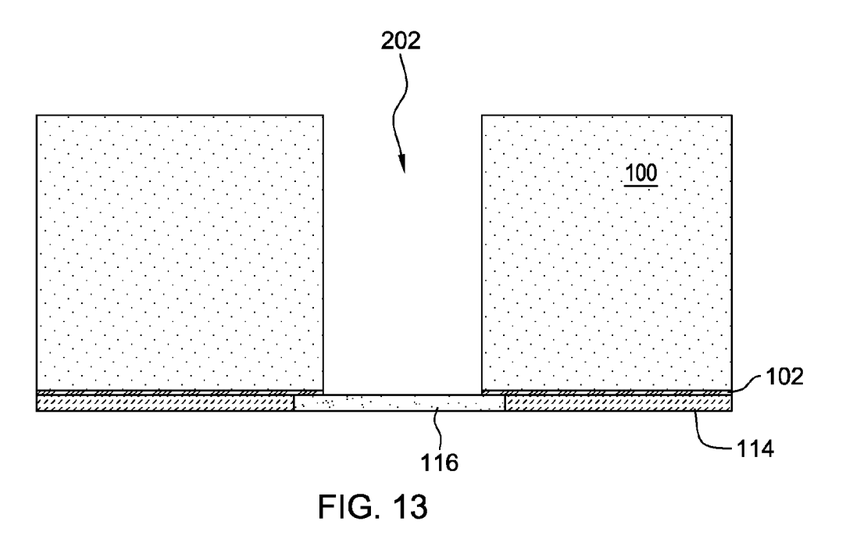
FIG. 13 depicts the etching of a TSV hole from the back side of the chip.

FIG. 13 depicts the etching of a TSV hole from the back side of the chip. Subsequent to the thinning process, TSV hole 202 is etched into substrate 100 from the back side and extends down to contact pad 116. An etch stop layer may be used on contact pad 116 to prevent an over-etch. For example, mask 102 may act as an etch stop layer and may be comprised of silicon nitride. Other types of etch stop materials, such as TaN, a nitrogen doped BLOK (NBLOK), or low k NBLOK, may be used.

Figure 14:
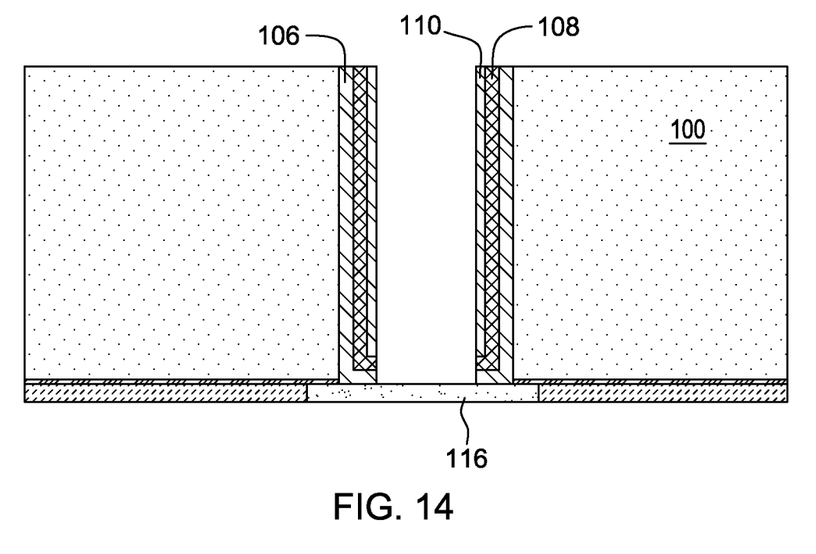
FIG. 14 illustrates the creation of a dual diffusion barrier in accordance with an embodiment of the present invention.

FIG. 14 illustrates the creation of a dual diffusion barrier in accordance with an embodiment of the present invention. Diffusion barrier layer 106 is deposited in a conforming manner within TSV hole 202, including over contact pad 116. Following this deposition, insulation layer 108 is deposited in a conforming manner within TSV hole 202. Subsequent to the deposition of insulation layer 108, diffusion barrier layer 110 is deposited within TSV hole 202. An anisotropic etch is performed to remove the horizontal portions of the aforementioned layers 106, 108, and 110 and again expose contact pad 116.

In an alternative embodiment, an anisotropic etch is performed after the deposition of each respective layer, with the result being that each respective layer extends along the sidewall of TSV hole 202 until it reaches contact pad 116.

Figure 15:
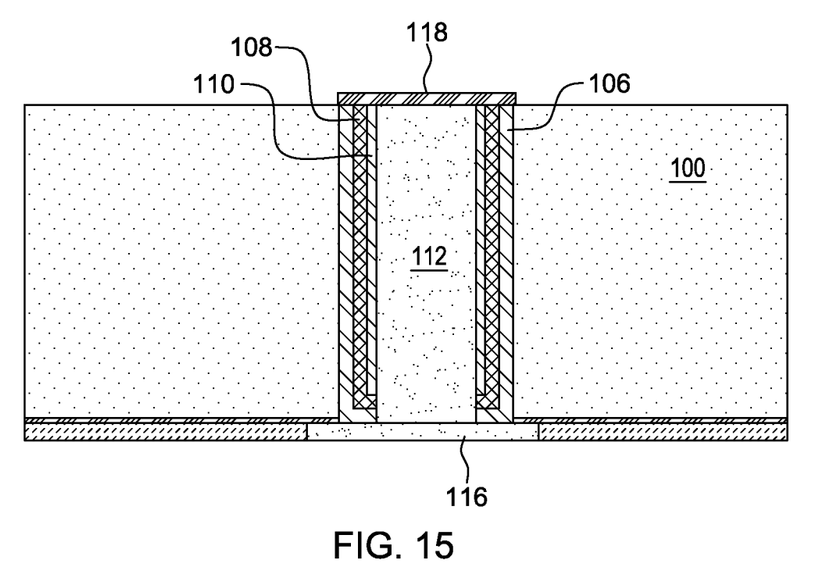
FIG. 15 shows the deposition of a conductive element into the TSV hole and deposition of a masking cap to protect the conductive element during subsequent processing steps.

FIG. 15 shows the deposition of a conductive element into the TSV hole and deposition of a masking cap to protect the conductive element during subsequent processing steps.

Conductive element 112 is preferably copper and extends to contact pad 116. A polishing step may be used to level conductive element 112 with rest of the back side of substrate 100. Masking cap 118 is deposited over conductive element 112. In one embodiment, masking cap 118 may also cover one or more of layers 106, 108, and 110. Masking cap 118 is preferably composed of SiN. Subsequent to the deposition of masking cap 118, the TSV pillar may be completed though the processing steps depicted in FIGS. 8, 9, and 10.

Figure 16:
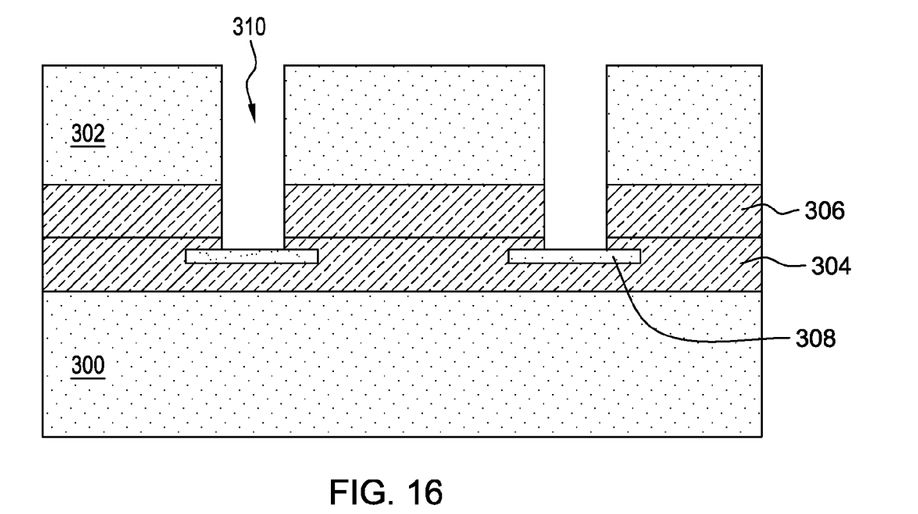
FIG. 16 depicts two chips in a face-to-face bond.
Figure 17:
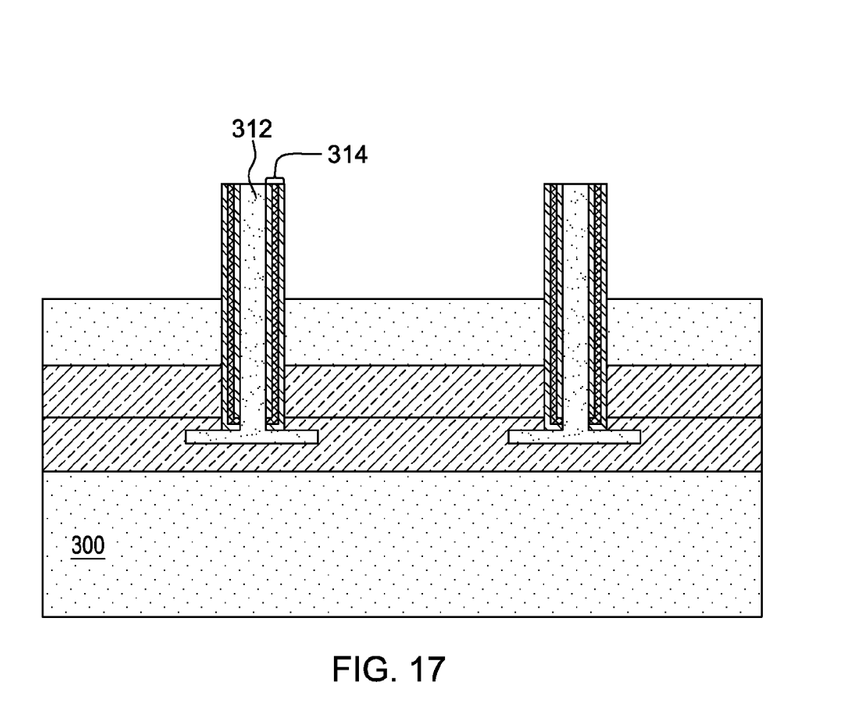
FIG. 17 illustrates the final steps of exposing TSV pillars by depositing a dual diffusion barrier and a conductive element into TSV holes in a substrate and subsequently etching the back face of the substrate to expose portions of the TSVs.

FIGS. 16 and 17 depict an alternative embodiment to the back side TSV pillar creation discussed in FIGS. 12 through 15.

In FIG. 16, two chips are bonded together. This may be accomplished through various adhesive techniques known in the art. The lower chip comprises semiconductor substrate 300 and BEOL levels 304. BEOL levels 304 comprise one or more wiring layers and/or one or more dielectric layers, and contact pads 308.

The upper chip is representative of an interposer and comprises semiconductor substrate 302 and BEOL levels 306. BEOL levels 306 comprise one or more dielectric layers.

Similar to the back side TSV creation steps depicted in FIGS. 12 through 15, one or more TSV holes, in this case TSV holes 310, may be etched into substrate 302 from the back side after substrate 302 has been thinned. However, where the chip is acting as an interposer, TSV hole 310 may extend past the BEOL levels 306 and into BEOL levels 304 of the lower chip to connect with contact pads 308.

FIG. 17 illustrates the final steps of exposing TSV pillars by depositing dual diffusion barrier 314 and conductive element 312 into TSV holes 310 and subsequently etching substrate 302 to expose portions of the TSVs.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described preferred embodiments of creating TSV pillars in an IC chip (which are intended to be illustrative and not limiting), it is noted that modifications and variations may be made by persons skilled in the art in light of the above teachings. It is therefore to be understood that changes may be made in the particular embodiments disclosed which are within the scope of the present invention as outlined by the appended claims.

What is claimed is:

1. A method for building a through-substrate via (TSV) for interconnecting an integrated circuit chip, the method comprising the steps of:

etching a TSV hole into a semiconductor substrate from one face of the semiconductor substrate, wherein the TSV hole has a depth less than an entire depth of the semiconductor substrate;

depositing a first diffusion barrier layer on the semiconductor substrate at a periphery of the TSV hole;

subsequently depositing an insulation layer on a surface of the first diffusion barrier layer;

subsequently depositing a second diffusion barrier layer on a surface of the insulation layer;

subsequently depositing a conductive material interior to the second diffusion barrier layer within the TSV hole;

subsequently thinning the semiconductor substrate from an opposite face of the substrate to expose at least a portion of the TSV;

depositing an etch resistant cap over the exposed portion of the TSV;

etching the thinned face of the substrate further to cause the exposed portion of the TSV to protrude from the thinned face of the substrate; and removing the etch resistant cap.

2. The method of claim 1, wherein the first diffusion barrier layer has a substantially uniform thickness around a periphery of the TSV hole, the insulation layer has a substantially uniform thickness around a periphery of the TSV hole, and the second diffusion barrier layer has a substantially uniform thickness around a periphery of the TSV hole.

3. The method of claim 1, wherein the first diffusion barrier layer comprises a refractory metal.

4. The method of claim 1, wherein the first diffusion barrier layer and the second diffusion barrier layer comprise tantalum nitride.

5. The method of claim 1, wherein the etch resistant cap comprises silicon nitride (SiN).

6. The method of claim 1, wherein the step of removing the etch resistant cap comprises a reactive-ion etch (RIE).

7. The method of claim 1, wherein the step of thinning the semiconductor substrate from the opposite face of the substrate to expose at least a portion of the TSV, further comprises etching through at least a portion of the first diffusion barrier layer, a portion of the insulating layer, and a portion of the second diffusion barrier layer to expose at least a surface of the conductive material within the TSV.

8. The method of claim 1, wherein the step of depositing the first diffusion barrier layer around the periphery of the TSV hole, comprises the steps of:
depositing the first diffusion barrier layer on the periphery of the TSV hole and a bottom of the TSV hole; and
subsequently, etching a portion of the first diffusion bather layer deposited on the bottom of the TSV hole to remove the portion of the first diffusion bather layer deposited on the bottom of the TSV hole.

9. The method of claim 1, further comprising the step of forming a conductive contact pad on the one face of the semiconductor substrate, the conductive pad having an electrical connection to the conductive material.

10. The method of claim 9, further comprising the step of, prior to thinning the semiconductor substrate from the opposite face to expose at least a portion of the TSV, bonding the one face of the semiconductor substrate to a separate integrated circuit chip, wherein the contact pad electrically connected to the conductive material also electrically connects to a contact pad on the separate integrated circuit chip.

11. A method for building a through-substrate via (TSV) for interconnecting an integrated circuit chip, the method comprising the steps of:

thinning a semiconductor substrate from a back face of the semiconductor substrate;
etching a TSV hole through the semiconductor substrate from the back face to a contact pad;
depositing one or more barrier layers on the semiconductor substrate at a periphery of the TSV hole;
depositing a conductive material interior to the one or more barrier layers within the TSV hole, wherein the conductive material electrically connects to the contact pad;
depositing an etch resistant cap over at least a portion of a surface of the conductive material at the back face of the semiconductor substrate;
etching the back face of the substrate further to expose a portion of the TSV so that the portion protrudes from the back face of the substrate; and
removing the etch resistant cap.

12. The method of claim 11, wherein the step of thinning the semiconductor substrate reduces the semiconductor substrate to a thickness equal to a desired length for the TSV.

13. The method of claim 11, wherein the step of depositing one or more barrier layers comprises the steps of:
depositing a first diffusion barrier layer on the semiconductor substrate at a periphery of the TSV hole;
subsequently depositing an insulation layer over a surface of the first diffusion barrier layer; and
subsequently depositing a second diffusion barrier layer over a surface of the insulation layer.

14. The method of claim 11, further comprising the step of, prior to etching the TSV hole, forming the contact pad on a front face of the semiconductor substrate.

15. The method of claim 11, further comprising the step of bonding a front face of the semiconductor substrate to a separate integrated circuit chip, wherein the contact pad is formed on the separate integrated circuit chip.

16. The method of claim 11, wherein the step of etching the TSV hole through the semiconductor substrate from the back face to the contact pad comprises, etching the TSV hole through the semiconductor substrate and into a second substrate, wherein the second substrate is bonded to the semiconductor substrate and wherein the contact pad resides within the second substrate.

* * * * *